United States Patent [19]

Mukherjee

[11] Patent Number: 5,751,038

[45] Date of Patent: May 12, 1998

[54] ELECTRICALLY ERASABLE AND PROGRAMMABLE READ ONLY MEMORY (EEPROM) HAVING MULTIPLE OVERLAPPING METALLIZATION LAYERS

[75] Inventor: Satyendranath Mukherjee, Yorkstown Heights, N.Y.

[73] Assignee: Philips Electronics North America Corporation, New York, N.Y.

[21] Appl. No.: 753,554

[22] Filed: Nov. 26, 1996

[51] Int. Cl.[6] .................. H01L 29/788; G11C 11/40
[52] U.S. Cl. .................. 257/316; 257/390; 265/104; 265/185.05
[58] Field of Search ................. 257/316, 390, 257/618; 365/104, 185.01, 185.05

[56] References Cited

U.S. PATENT DOCUMENTS

| 5,146,426 | 9/1992 | Mukherjee et al. ............... 365/149 |
| 5,338,953 | 8/1994 | Wake ............................. 257/316 |
| 5,392,237 | 2/1995 | Iida .............................. 257/316 |

FOREIGN PATENT DOCUMENTS

| 0468938A2 | 1/1992 | European Pat. Off. ...... H01L 27/115 |
| 0477938A2 | 4/1992 | European Pat. Off. ........ G11C 16/04 |
| 0486444A2 | 5/1992 | European Pat. Off. ...... H01L 27/115 |
| 62-269363 | 11/1987 | Japan ......................... H01L 29/78 |
| 479369A | 3/1992 | Japan ........................ H01L 27/115 |

Primary Examiner—Gene M. Munson
Attorney, Agent, or Firm—Steven R. Biren

[57] ABSTRACT

An electrically erasable and programmable read only memory (EEPROM) includes an array of trench memory cells, with each memory cell having a semiconductor drain region adjacent a surface-adjoining portion of the trench. The EEPROM is provided with at least two overlapping metallization layers overlying the memory cells and separated from each other and from the trenches and the drain regions by regions of insulating material. The overlapping metallization layers contact the drain regions of the underlying memory cells through the insulating material. This configuration results in a memory array having a very high packing density.

8 Claims, 2 Drawing Sheets

ELECTRICALLY ERASABLE AND PROGRAMMABLE READ ONLY MEMORY (EEPROM) HAVING MULTIPLE OVERLAPPING METALLIZATION LAYERS

BACKGROUND OF THE INVENTION

The invention is in the field of Read Only Memory (ROM) devices, and relates specifically to Electrically Erasable and Programmable Read Only Memory (EEPROM) devices.

EEPROM devices in general, and methods for making such devices, are well known in the art. Typically, an EEPROM structure has a floating gate and a control gate, both of which are typically fabricated out of polycrystalline silicon doped with an appropriate doping material to render the polycrystalline conductive. A typical doping material is phosphorus.

The floating gate is separated from a substrate region by a gate dielectric layer of insulating material such as silicon dioxide, while the substrate region includes source and drain regions with a channel region therebetween. The floating gate and the control gate are separated by an intergate dielectric, typically silicon dioxide. The basic principle upon which EEPROM devices operate is that charge is stored on the floating gate in a capacitive manner and can subsequently be electrically erased.

The write or erase voltage, i.e., the voltage which is needed to place charge on or to remove charge from the floating gate, has typically been high, i.e. in excess of 20 volts. This, in turn, places shrinkage limits on gate oxide thickness of control transistors, junction depth and die size.

Silicon nitride ($Si_3N_4$) has also been used in an insulating layer of a dual dielectric (thermal oxide and silicon nitride) between the floating gate and the control gate. Silicon nitride has the property that is more dense than silicon dioxide, and, therefore, affords higher capacitive coupling between the floating gate and the control gate. A typical dual dielectric between the floating gate and the control gate is composed of 500 angstroms or less oxide and 400 angstroms or less nitride. However, even with the use of silicon nitride as the insulating layer, the write and erase voltage is still relatively high, typically in excess of 12 volts. High erase and program voltages for conventional EEPROM devices are a major drawback. Use of such high voltages has required a separate high voltage supply when operating the devices, or the use of special voltage multiplying circuitry within the device to boost the supply voltage to the requisite program and erase levels.

As noted in U.S. Pat. No. 5,146,426, incorporated herein by reference in its entirety and in which the present inventor is a co-inventor, an ongoing design objective in this field, as integration techniques have advanced and integrated circuit chip densities have continued to grow, has been to achieve ever more compact memory cell configurations. In particular, the trench-structure memory cell disclosed in U.S. Pat. No. 5,146,426 achieves a highly-compact and efficient memory cell configuration.

However, as integration techniques have continued to advance, and chip densities have continued to grow, it has been found that the attainment of still higher memory cell densities has been limited by the metal interconnection pitch or required spacing for the metal interconnection layers associated with the memory cells. In the typical prior-art fabrication process, the metal layers do not fully exploit the lithography limits of the existing technology. Thus, for example, a 0.5 micron technology has a metal layer which is about 0.7 microns or wider, a constraint which arises primary from the reflectivity of metal layers and the resulting line and space resolution problems ensuing therefrom. As a result, the packing density capability of trench-base memory cells such as those shown in U.S. Pat. No. 5,146,426 has not been fully exploited due to constraints arising from the use of the conventional single-layer metal technology of the prior art.

Accordingly, it would be desirable to have an EEPROM device in which cell density is not limited by constraints associated with device metallization and in which the lithography limits of the existing technology can be fully exploited.

SUMMARY OF THE INVENTION

It is therefore an object of the invention to provide an EEPROM device in which a more efficient metallization configuration is employed in order to fully realize the packing-density benefits of extremely compact trench-based memory cells.

In accordance with the invention, this object is achieved by an EEPROM device of the type described above in which the array of memory cells is provided with at least two overlapping metallization layers overlying the memory cells and separated from each other and from the trenches and the drain regions by regions of insulating material, with each of the overlapping metallization layers contacting the drain region of at least one underlying memory cell through the insulating material.

In a preferred embodiment of the invention, a single semiconductor layer is provided as the drain region for a plurality of memory cells in a single column, and each overlapping metallization layer contacts an underlying semiconductor layer, with the underlying semiconductor layer forming the drain region for a plurality of memory cells in a single column.

In a further preferred embodiment of the invention, each metallization layer contacts the underlying semiconductor layer through the insulating material at a number of contact locations which is less than the number of memory cells in the single column.

In yet a further preferred embodiment of the invention, the overlapping metallization layers are provided with staggered electrical contacts in order to achieve a further improvement in packing density.

EEPROM devices in accordance with the present invention offer a significant improvement in that the use of a multi-layer overlapping metallization configuration permits the packing density capability of compact trench-based memory devices to be exploited more fully than was the case with conventional prior-art metallization configurations.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which.

Figure 1:
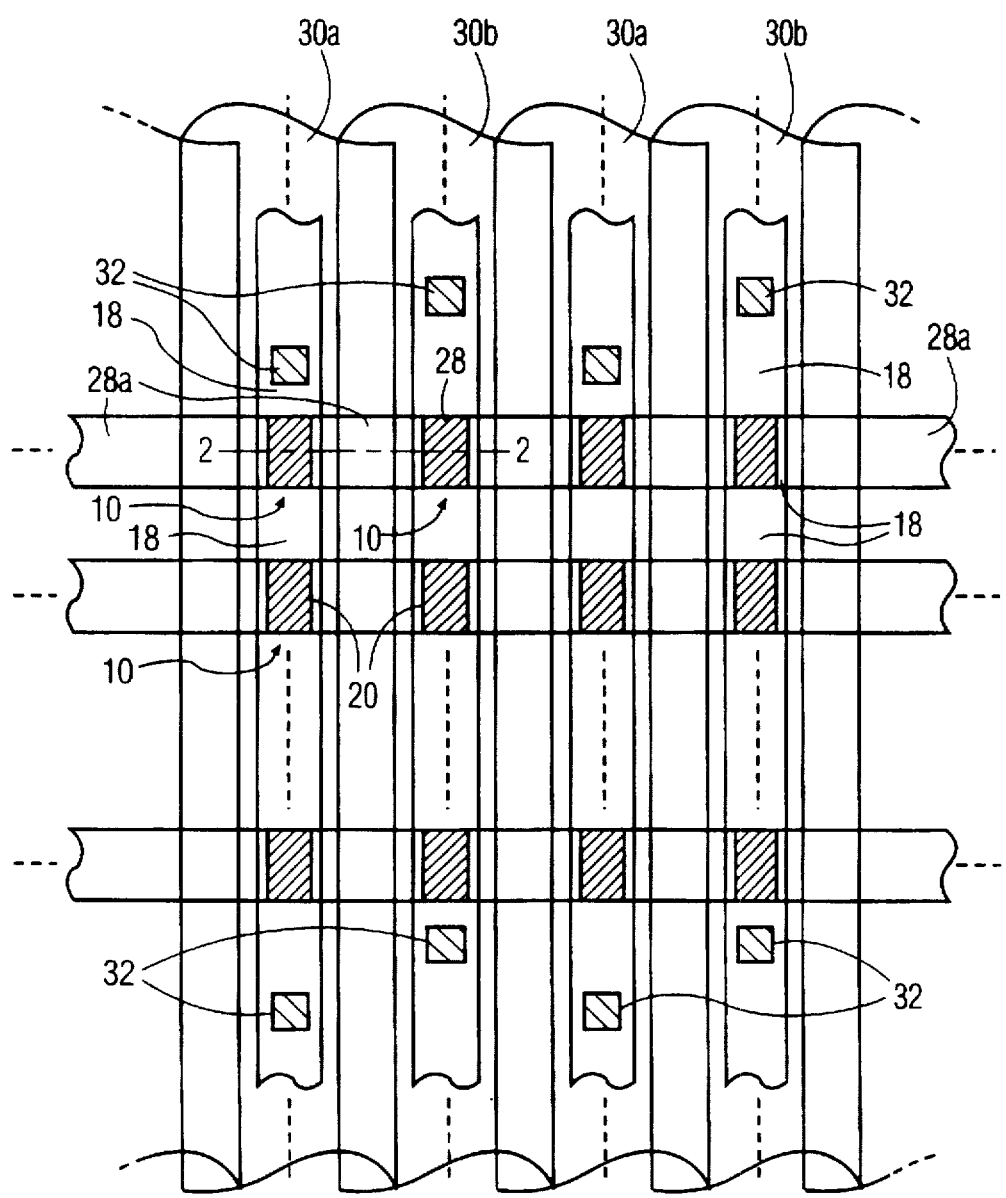
FIG. 1 shows a simplified plan view of a portion of an EEPROM memory cell array in accordance with the invention.

In the drawing, semiconductor regions having the same conductivity type are generally shown hatched in the same direction, and it should be noted that the figures are not drawn to scale or in proportion.

DESCRIPTION OF THE PREFERRED EMBODIMENTS

Figure 2:
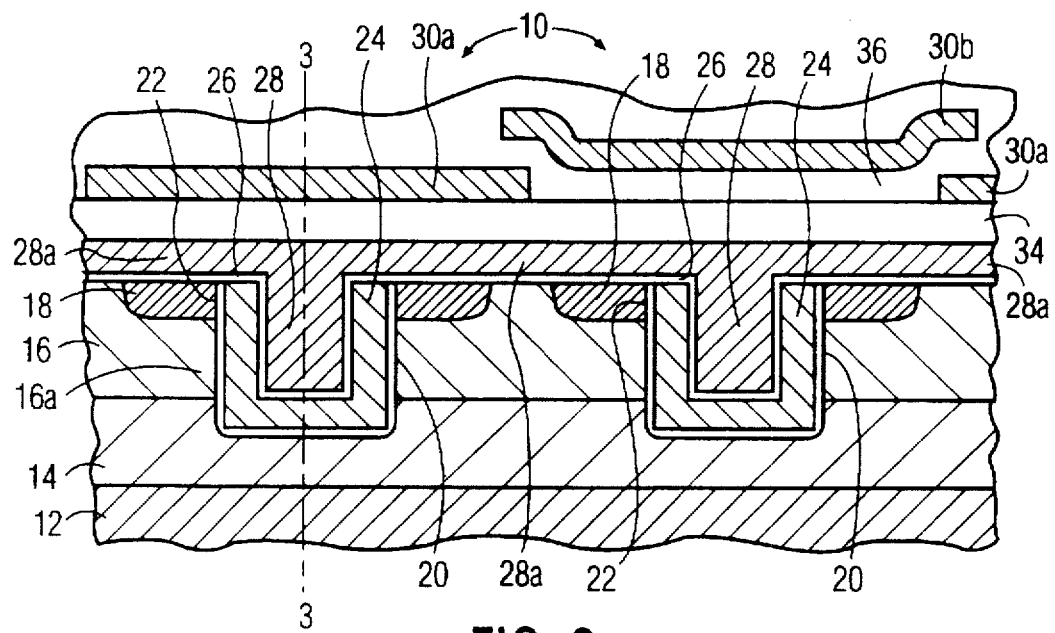
FIG. 2 shows a cross-sectional view taken along the section line 2—2 in FIG. 1.
Figure 3:
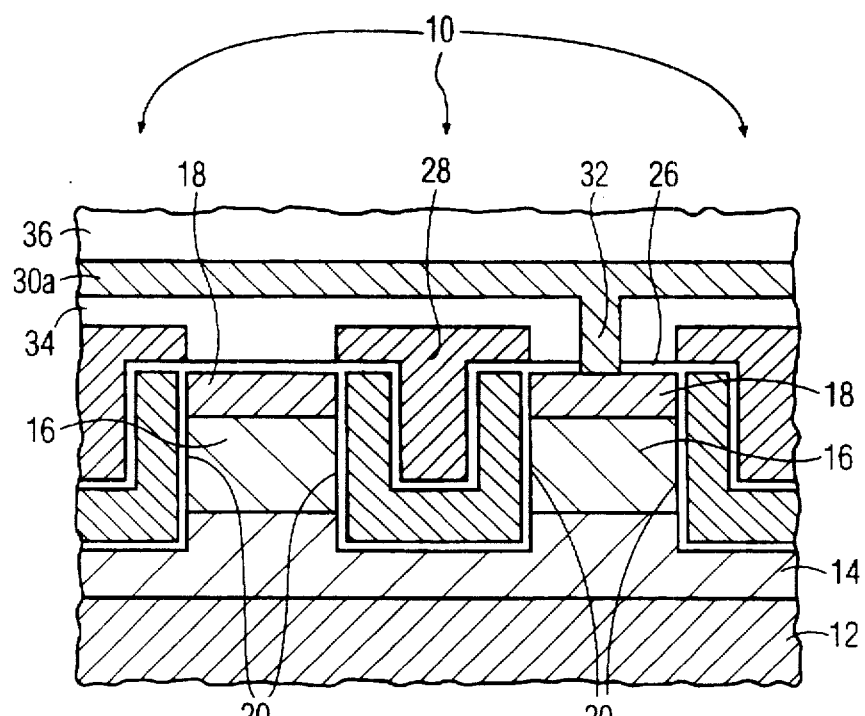
FIG. 3 shows a cross-sectional view taken along the section line 3—3 in FIG. 2.

A simplified plan view of a portion of an EEPROM memory cell array in accordance with the invention is shown in FIG. 1, with further details of the individual memory cells and their interconnections shown in FIGS. 2 and 3. In overview fashion, FIG. 1 shows an array of rows and columns of memory cells 10, with semiconductor layers 18, to be described in further detail hereinafter, forming the drain regions of the memory cells and also serving to interconnect the drain regions of memory cells in the same vertical column. In this manner, memory cells 10, which are formed in and adjacent to trenches 20, have interconnected drain regions by virtue of their contact with the vertically-oriented drain regions 18.

Control gates 28 of the memory cells 10 are interconnected by horizontal gate lines 28a, with the control gates 28 and gate line portions 28a forming continuous strips in the horizontal direction as can be more clearly seen in FIG. 2.

The simplified view of FIG. 1 is completed by a series of overlapping metallization layers 30a, 30b, with each layer 30a being on a lower level, and each overlapping layer 30b being on a higher level, as more clearly seen in FIG. 2. These overlapping metallization layers extend in the vertical direction over the columns of memory cells 10 and contact the underlying drain regions 18 via contact regions 32. Since the drain regions within each column are continuous in the vertical direction, a separate contact need not be made to the drain region of each individual memory cell 10, although more than one contact region 32 per column of memory cells may be desirable, since the resistance of the semiconductor layer 18 may become too high for optimum performance if only a single contact region 32 is provided. Typically, contacts can be made to every 8th, 16th, 32nd, etc. memory cell, depending upon the amount of resistance that can be tolerated in a given circuit design. By providing contact region 32 every so often in the vertical direction, as shown in FIG. 1, the semiconductor layer 18 is connected to the lower-resistivity overlying metallization layers at regular intervals, thus maintaining a low resistance level even in a relatively long column of memory cells. The overlapping metallization layers 30a, 30b may be made of any suitable metal, such as aluminum or alloys of aluminum, silicon and copper.

As noted above, a 0.5 micron technology typically has a metal layer which is about 0.7 micron or larger in width, thus preventing the full benefit of the technology from being realized. By using the configuration of the present invention, with its overlapping metallization layers, this constraint is removed, and the full benefits of submicron technology can be achieved, since the pitch is no longer limited by metallization line width. Additionally, it has been found that staggered contact regions 32, as shown by the vertical offset between adjacent contact regions 32 in FIG. 1 can be advantageously employed in extremely compact configurations.

It will also be apparent that, although a structure showing two overlapping metallization layers has been shown and described, the principles described herein can also be applied to a triple-layer metallization configuration. Further details of the memory cell array will now be described in conjunction with FIGS. 2 and 3.

FIG. 2 of the drawing shows two adjacent single-transistor trench Electrically Erasable and Programmable Read Only Memory (EEPROM) cells 10 in accordance with the invention, in a view taken along the section line 2—2 in FIG. 1. The device is formed in a semiconductor body having a first semiconductor layer 12 of a first conductivity type (here n type) and a high doping level of about $10^{19}$at/cm$^3$, and a second semiconductor layer 14 of the first conductivity type on the first layer and having a lower doping level of about $10^{16}$at/cm$^3$ and a thickness of about 0.5 μ. The first layer may either be a buried layer or the substrate of the device, and the first and second layers, taken together, form the source regions of the EEPROM cells. A third semiconductor layer 16 of a second conductivity type (here p type) is provided on the second layer and extends to the surface of the device. The thickness of this layer is about 0.6–1.0 μ and its doping level is about $5\times10^{17}$at/cm$^3$. A fourth surface-adjoining, highly-doped semiconductor layer 18 of the first conductivity type is provided locally in the third layer and forms a drain region of each memory cell. This fourth layer has a doping concentration of about $10^{20}$at/cm$^3$ and a thickness of about 0.1–0.4 μ.

A trench 20 extends though the third and fourth layers 16, 18 and partly into but not through the second layer 14. In this embodiment, it is contemplated that the trench will have a substantially square configuration when viewed from above, but rectangular, circular or other shapes are also possible. A channel region 16a is located in a portion of the third layer 16 adjacent the sidewall portion of the trench and extending in a substantially vertical direction from the source region to the drain region of the device.

The trench sidewalls and floor are covered with a gate dielectric 22 formed of an insulating material such as silicon dioxide and having a thickness of about 100 to 200 angstroms. The gate dielectric 22 may have a localized portion of reduced thickness in a lower corner region of the trench, in the area adjacent the intersection of the trench sidewalls and floor, as shown and described in U.S. Pat. No. 5,146,426.

A floating gate 24, in this example of polysilicon, is provided on the gate dielectric and extends adjacent the sidewalls and floor of the trench, as shown in FIG. 2. The interior portions of the floating gate 24 are covered by an intergate dielectric 26, which may be formed of a layer of silicon dioxide or silicon dioxide and silicon nitride having a thickness of about 200 angstroms. The basic structure of the device shown in FIG. 1 is completed by a control gate 28, typically of polysilicon formed on the intergate dielectric 26 and extending within the trench 20 to about the same depth as the third layer 16, with the control gate 28 being separated from the channel region 16a by floating gate 24, gate dielectric 22 and intergate dielectric 26. As can be see in FIGS. 1 and 2, the control gates 28 of a row of cells 10 are interconnected by regions 28a, which may be formed integrally with the control gates and of the same polysilicon material.

The structure of FIG. 2 is completed by a dielectric layer 34, formed of an insulating material such as silicon dioxide and having a thickness of about 5000 angstroms. Metallization layers 30a, previously described in connection with FIG. 1, are provided above dielectric layer 34 at locations above alternate columns of memory cells 10. Adjacent metallization layers 30a are separated and insulated from each other in the lateral direction by a portion of a further dielectric layer 36, formed of an insulating material such as silicon dioxide, with dielectric layer 36 also serving to support and insulate metallization layers 30b over alternating memory cells 10 which are not covered by metallization layers 30a. The height of the major portion of metallization layers 30b above the upper surface of control gates 28 is about 1 micron.

Although FIG. 2 is not drawn to scale, and it will be apparent that the width of metallization layers 30a and 30b will depend upon the size of the memory cells 10 as well as the limits of the technology employed, it is important to note that the width of the metallization layers 30a, 30b is greater than that of the underlying memory cells. Thus, if a conventional, single-layer metallization as it is commonly employed in the prior art were to be used, adjacent memory cells as shown in FIG. 2 would have to be more widely spaced from each other, in order to accommodate both the full width of the overlying metallization layers and an additional space for a dielectric or insulating region between adjacent metallization layers, since these metallization layers would then be on the same level and would have to be insulated from each other to prevent undesired electrical contact. In the configuration in accordance with the present invention, on the other hand, the use of two (or more) layers of overlapping metallization permits a significantly closer spacing, since the total width of the metallization structure is less than the total widths of the individual metallization layers, rather than being more than the total width of these metallization layers as would be the case with prior-art technology. In this manner, the invention permits the full packing-density advantages of highly-compact trench memory cells to be realized.

FIG. 3 shows three adjacent memory cells of the array 10, viewed along the section line 3—3 in FIG. 2. In this view it can be seen that the device construction in this direction is generally similar to that shown in FIG. 2, with like regions being provide with like reference numerals for ease of identification. However, it is important to note that the drain regions 18, which extend only locally around each trench 20 in FIG. 2, extend in the orthogonal view of FIG. 3 completely across to the trench sidewall of the next adjacent EEPROM cell 10. Thus, the surface-adjoining region 18 forms the drain region for each adjacent cell as well as an integral interconnection between the cells. In this manner a simple and highly efficient configuration is achieved, in which bit-line continuity is provided by region 18, thus eliminating the need for separate metallization and drain contacts at each cell. This results in a substantial simplification in the overall device structure as well as a significant reduction in cell size.

In FIG. 3, which is a cross-sectional view perpendicular to that shown in FIG. 2, the lower metallization layers 30a can be seen to extend over a plurality of memory cells 10, separated and insulated therefrom by dielectric layer 34 and covered by a portion of dielectric layer 36. Also shown in FIG. 3 is a contact region 32, formed by a downward extension of metallization layer 30a through dielectric layers 34 and 26. In this manner, electrical connections between the overlying metallization layers such as 30a and the underlying semiconductor layers 18 forming the drain regions can be obtained in a simple and space-efficient manner. As can be seen in FIG. 3, electrical connections need not be provided to every segment of semiconductor layer 18, since this semiconductor layer is electrically continuous due to the portions of layer 18 that "wrap around" the trenches 20 as shown in FIG. 2. The number of memory cells per electrical connection will be determined as a function of the permissible electrical resistance in this portion of the circuit, with connections typically being formed at every 8th, 16th, 32nd, etc. cell, as noted above.

In this manner, the present invention provides an EEPROM device in which a more efficient metallization configuration is employed in order to fully realize the packing-density benefits of extremely compact trench-based memory cells.

While the invention has been particularly shown and described with reference to several preferred embodiments thereof, it will be understood by those skilled in the art that various changes in form and detail may be made without departing from the spirit or scope of the invention. Thus, for example, a triple-layer metallization technology may be employed instead of the double-layer technology shown in the figures, and the size, shape and geometry of the contact regions can be varied to suit particular design requirements.

What is claimed is:

1. An Electrically Erasable and Programmable Read Only Memory (EEPROM) having an array of memory cells, each memory cell having a trench configuration and a semiconductor drain region adjacent a surface-adjoining portion of said trench, characterized in that said EEPROM is provided with at least two overlapping metallization layers overlying said memory cells separated from each other and from said trenches and said drain regions by regions of insulating material, and in that each of said overlapping metallization layers contact the drain region of at least one underlying memory cell through said insulating material.

2. An EEPROM as in claim 1, wherein a single semiconductor layer is provided as the drain regions for a plurality of memory cells in a single column.

3. An EEPROM as in claim 2, wherein each of said overlapping metallization layers contacts an underlying semiconductor layer, with each semiconductor layer forming the drain region for a plurality of memory cells in a single column.

4. An EEPROM as in claim 3, wherein each metallization layer contacts the underlying semiconductor layer beneath said metallization layer through said insulating material at a number of contact locations which is less than the number of memory cells in the single column.

5. An EEPROM as in claim 4, wherein the number of memory cells is 8 times larger than the number of contact locations.

6. An EEPROM as in claim 4, wherein the number of memory cells is 16 times larger than the number of contact locations.

7. An EEPROM as in claim 4, wherein the number of memory cells is 32 times larger than the number of contact locations.

8. An EEPROM as in claim 1, wherein said at least two overlapping metallization layers are provided with staggered electrical contacts.

* * * * *